United States Patent
Paranjpe et al.

(10) Patent No.: US 6,444,263 B1
(45) Date of Patent: Sep. 3, 2002

(54) METHOD OF CHEMICAL-VAPOR DEPOSITION OF A MATERIAL

(75) Inventors: Ajit P. Paranjpe, Sunnyvale; Randhir S. Bubber, San Ramon; Sanjay Gopinath; Thomas R. Omstead, both of Fremont; Mehrdad M. Moslehi, Los Altos, all of CA (US)

(73) Assignee: CVC Products, Inc., Rochester, NY (US)

( * ) Notice: Subject to any disclaimer, the term of this patent is extended or adjusted under 35 U.S.C. 154(b) by 25 days.

(21) Appl. No.: 09/663,209

(22) Filed: Sep. 15, 2000

(51) Int. Cl.$^7$ ............................................... C23C 16/16

(52) U.S. Cl. .................... 427/250; 427/255.7

(58) Field of Search ................ 427/252, 250, 427/255.7

(56) References Cited

U.S. PATENT DOCUMENTS

| | | | |
|---|---|---|---|
| 4,510,182 A | * 4/1985 | Cornils et al. ............... | 427/162 |
| 4,789,598 A | 12/1988 | Howard et al. | |
| 4,792,378 A | 12/1988 | Rose et al. | |
| 4,825,809 A | 5/1989 | Mieno | |
| 4,929,468 A | * 5/1990 | Mullendore ............ | 427/255.32 |
| 4,938,999 A | * 7/1990 | Jenkin ......................... | 427/252 |
| 4,948,623 A | 8/1990 | Beach et al. | |
| 4,965,656 A | 10/1990 | Koubuchi et al. | |
| 4,970,093 A | 11/1990 | Sievers et al. | |
| 5,082,542 A | 1/1992 | Moslehi et al. | |
| 5,085,731 A | 2/1992 | Norman et al. | |
| 5,098,516 A | 3/1992 | Norman et al. | |
| 5,112,448 A | 5/1992 | Chakravorty | |
| 5,171,610 A | * 12/1992 | Liu ............................. | 427/252 |
| 5,231,751 A | 8/1993 | Sachdev et al. | |
| 5,268,034 A | 12/1993 | Vukelic | |
| 5,312,509 A | 5/1994 | Eschbach | |
| 5,354,712 A | 10/1994 | Ho et al. | |
| 5,453,124 A | 9/1995 | Moslehi et al. | |
| 5,464,656 A | 11/1995 | Verkade | |
| 5,594,278 A | 1/1997 | Uchiyama | |
| 5,595,606 A | 1/1997 | Fujikawa | |

(List continued on next page.)

FOREIGN PATENT DOCUMENTS

| | | |
|---|---|---|
| EP | 0093971 A2 | 4/1983 |
| EP | 0297348 A1 | 1/1989 |
| EP | 0698918 A1 | 2/1996 |
| EP | 0725439 A2 | 8/1996 |
| EP | 0881673 A2 | 12/1998 |

OTHER PUBLICATIONS

"Selectivity in low pressure chemical vapor deposition of copper from hexafluoroacetylacetonate–copper(1)–trimethylvinylsilane in the presence of water," by Strumm et al. in *Materials Science and Engineering*, B23, pp. 48–53, Feb. 1994.

English language translation of Abstract for Japanese Patent Application 07057312; Mar. 3, 1995.

(List continued on next page.)

*Primary Examiner*—Bret Chen
(74) *Attorney, Agent, or Firm*—Baker Botts, L.L.P.

(57) ABSTRACT

A method for chemical-vapor deposition of a material film adds precursor decomposition by-product to the precursor flow to suppress premature gas-phase precursor decomposition and improve process repeatability and film quality. In one embodiment, CVD cobalt films are deposited with carbonyl precursors with reduced premature gas-phase reaction and particulate generation by the addition of excess carbon monoxide to the process chamber comprising the precursor flow. The addition of carbon monoxide not only suppresses gas-phase reaction but also improves cobalt film purity. The addition of excess carbon monoxide to CVD cobalt precursor flow provides repeatable deposition of glue and nucleation layers to support CVD copper, and is extendable to the deposition of high purity CVD cobalt for other applications and with other precursors, and also extendable for CVD $CoSi_2$ films and other cobalt-containing applications.

20 Claims, 1 Drawing Sheet

U.S. PATENT DOCUMENTS

| | | | |
|---|---|---|---|
| 5,624,498 | A | 4/1997 | Lee et al. |
| 5,674,787 | A | 10/1997 | Zhao et al. |
| 5,689,227 | A | 11/1997 | Nguyen et al. |
| 5,723,028 | A | 3/1998 | Poris |
| 5,723,387 | A | 3/1998 | Chen |
| 5,730,801 | A | 3/1998 | Tepman et al. |
| 5,736,191 | A | 4/1998 | Biernath |
| 5,755,859 | A | 5/1998 | Brusic et al. |
| 5,763,953 | A | 6/1998 | Iijima et al. |
| 5,766,379 | A | 6/1998 | Lanford et al. |
| 5,789,321 | A | 8/1998 | Ohshita |
| 5,792,593 | A | 8/1998 | McClure et al. |
| 5,824,590 | A | 10/1998 | New |
| 5,843,516 | A | 12/1998 | Derbenwick et al. |
| 5,852,088 | A | 12/1998 | Dismukes et al. |
| 5,866,237 | A | 2/1999 | Angelopoulos et al. |
| 5,891,348 | A | 4/1999 | Ye et al. |
| 5,891,513 | A | 4/1999 | Dubin et al. |
| 5,916,359 | A | 6/1999 | Baum et al. |
| 5,948,467 | A | 9/1999 | Nguyen et al. |
| 5,969,422 | A | 10/1999 | Ting et al. |
| 6,015,917 | A | 1/2000 | Bhandari et al. |
| 6,054,227 | A | 4/2000 | Greenberg et al. |
| 6,057,237 | A | 5/2000 | Ding et al. |
| 6,063,506 | A | 5/2000 | Andricacos et al. |
| 6,136,682 | A | 10/2000 | Hedge et al. |
| 6,181,012 | B1 | 1/2001 | Edelstein et al. |

OTHER PUBLICATIONS

"Chemical vapor deposited TiCN: A new barrier metallization for submicron via and contact applications," by Eizenberg et al. in the *Journal of Vacuum Science and Technology*: Part A, U.S., American Institute of Physics, New York, May 1, 1995.

"Chemical vapor deposition TiN process for contact/via barrier applications" by Paranjpe et al. in the *Journal of Vacuum Scienc and Technology*: Part B, U.S., American Institute of Physics, New York, Sep. 1, 1995.

English language translation of Abstract from Japanese Patent Application No. 10092977; Mar. 4, 1997.

English language translation of Abstract from Japanese Application No. 10242409; Apr. 30, 1997.

English language translation of Abstract from Japanese application No. 06203379; Jul. 22, 1997.

"An Evaluation of Cu Wiring in a Production 64Mb DRAM," by Cote et al. IBM Semiconductor Research and Development Center, IBM Microelectronics Division, Hopewell Junction, NY, *1998 Symposium on VLSI Technology Digest of Technical Papers*, pp. 24–25, Jun. 1998.

"A High Performance 3.97 $\mu^2$ CMOS SRAM Technology Using Self–Aligned Local Interconnect and Copper Interconnect Metalization," by Woo, et al. Networking and Computing Systems Group, Process Technology Development, Motorola Inc., Austin, Texas, *1998 Symposium on VLSI Technology Digest of Technical Papers*, pp. 12–13, Jun. 1998.

"A Cu/Low–k Dual Damascene Interconnect for high Performance and Low Cost Integrated Circuits" by Zhao et al. Rockwell Semiconductor Systems, 4311 Jamboree Road, Newport Beach, CA, *1998 Symposium on VLSI Technology Digest of Technical Papers*, pp. 28–29, Jun. 1998.

"A High–Performance Sub–0.23 $\mu$m CMOS Technology with Multiple Thresholds and Copper Interconnects" by Schulz et al. IBM Semiconductor Research and Development Center, Hopewell Junction, NY *1998 Symposium on VLSI Technology Digest of Technical Papers*, pp. 18–19, Jun. 1998.

"An Inlaid CVD Cu Based Integration for Sub 0.23 $\mu$m Technology" by Denning et al. Advanced Products Research and Development Laboratory, Motorola, 3501 Ed Bluestein Blvd., Austin, TX, *1998 Symposium on VLSI Technology Digest of Technical Papers*, pp 22–23, Jun. 1998.

"The Effects of Processing Parameters in the Chemical Vapor Deposition of Cobalt from Cobalt TriCarbonyl Nitrosyl," by Ivanova et al. in the *Journal of the Electrochemical Society*, vol. 146 pp 2139–2145, Revised Dec. 22, 1998.

Communication relating to the results of the Partial International Search for PUT/US 99/15583, Dec. 20, 1999.

PCT International Search PCT/US 99/15583, Apr. 14, 2000.

PCT International Search Report for PCT/US 99/30662, May 23, 2000.

Written Opinion for PCT Application No. US 99/30662, Nov. 27, 2000.

* cited by examiner

METHOD OF CHEMICAL-VAPOR DEPOSITION OF A MATERIAL

TECHNICAL FIELD OF THE INVENTION

This invention relates in general to the field of semiconductor electronic devices, and more particularly to an improved method for deposition of a material, such as cobalt, with a chemical-vapor deposition process while suppressing premature gas-phase decomposition of the precursor material.

BACKGROUND OF THE INVENTION

The use of copper metalization for microelectronic semiconductor integrated circuit chip interconnects provides a number of advantages over aluminum metalization, including reduced interconnect propagation delays, reduced cross talk, and higher interconnect current densities with extended electromigration lifetime. Of the methods available for deposition of copper, chemical-vapor deposition (CVD) provides a number of advantages, including the capability for fully vacuum cluster integrated deposition of diffusion barrier and copper layers through cluster tool equipment, excellent gap-fill characteristics for high-aspect ratio via holes and trenches, excellent step coverage, compatibility with single and dual damascene processing, and a relatively low thermal budget for compatibility with low-k organic inter-level/inter-metal dielectrics. However, copper deposited by CVD tends to have poor adhesion when deposited on a substrate, such as on a diffusion barrier, making its incorporation in device structures difficult. For instance, poor copper adhesion often results in delamination of copper layers from underlying barrier layers during chemical-mechanical polishing (CMP) and other fabrication steps.

One solution to the problem of poor adhesion of CVD copper layers is the use of a CVD cobalt glue layer between the CVD copper and barrier layers. This adhesion technique is described in greater detail in U.S. patent application Ser. No. 09/219,147, filed Jul. 10, 1998, now U.S. Pat. No. 6,294,836, entitled "SEMICONDUCTOR CHIP INTERCONNECT BARRIER MATERIAL AND FABRICATION METHOD," and U.S. patent application Ser. No. 09/518,294, filed Mar. 3, 2000 entitled "MICROELECTRONIC INTERCONNECT MATERIAL WITH ADHESION PROMOTION LAYER AND FABRICATION METHOD, both developed by and commonly assigned to CVC Products, Inc., and each of which are incorporated herein by reference. CVD cobalt is commonly deposited by using carbonyl precursors because carbonyl precursors tend to deposit cobalt films that are relatively carbon free. For instance, carbonyl precursors provide carbon impurity levels typically below five percent while alternative precursors, such as $Cp_2Co$ and $CpCo(CO)_2$ generally include greater than ten percent carbon impurity levels. However, CVD cobalt processes with carbonyl precursors tend to have poor process repeatability and uniformity and can generate particulates that result in process drift over time. For instance, one typical set of process conditions for deposition of cobalt with a carbonyl precursor is: 1 sccm of $Co(CO)_3NO$ carbonyl precursor transported by 15 sccm of He carrier gas, 1500 sccm of $H_2$, 15 sccm of backside Ar in a 2 Torr chamber pressure and a 400° C. wafer temperature. For these typical process conditions, a significant process drift and a soot-like particulate formation occurs on the showerhead and chamber walls, impacting the repeatability of the deposition process over multiple process cycles.

SUMMARY OF THE INVENTION

Therefore a need has arisen for a method for chemical vapor deposition of a material on a substrate with improved process repeatability and reduced process drift.

A further need exists for a method for chemical vapor deposition of cobalt using carbonyl precursors with good process repeatability. While maintaining process equipment chamber cleanliness.

A further need exists for a method for chemical vapor deposition of a copper layer on a substrate with improved adhesion provided by a cobalt glue layer.

In accordance with the present invention, a method for deposition of a material on a substrate is provided that substantially eliminates or reduces disadvantages and problems associated with previously developed methods of chemical-vapor deposition with a precursor. Deposition of the material onto the substrate occurs with improved repeatability by suppression of the premature gas-phase decomposition of the precursor due to the addition of decomposition by-products to the precursor during deposition of the material.

More specifically, in one embodiment, repeatability of deposition of a material with carbonyl precursors is improved by the addition of carbon monoxide (CO) to the carbonyl precursor during deposition of the material. Carbon monoxide is a reaction by-product produced during decomposition of carbonyl precursors. The addition of carbon monoxide in the gas phase of deposition process with a carbonyl precursor drives the gas phase reaction in a reverse direction, thereby resulting in suppression of premature precursor decomposition. This suppression aids process repeatability and process equipment cleanliness by reducing process drift and particulate formation on the showerhead and chamber walls.

In one embodiment, the material deposited by the carbonyl precursor is cobalt. For instance, the carbonyl precursor of $Co(CO)_3NO$ is sublimed in a bubbler with a helium carrier gas and excess hydrogen gas used as the diluent gas. Excess carbon monoxide is added to the flow to suppress premature gas-phase precursor decomposition as the flow proceeds from the showerhead towards the substrate. Suppression of precursor decomposition in the gas phase reduces particulate formation, resulting in repeatable deposition of a high quality cobalt film on the substrate. The cobalt film provides an excellent and commercially-viable glue layer to support deposition of copper on the substrate with good adhesion.

The present invention provides a number of important technical advantages. One important technical advantage is the deposition of a material with a precursor having improved process repeatability. The addition of a precursor decomposition by-product to the precursor flow in the gas phase advantageously suppresses premature decomposition of the precursor, thereby reducing particulate formation on the showerhead and chamber walls. Reduced contaminants in the process chamber provide reduced process drift and result in consistent deposition of high quality films of material in a repeatable manner over many wafer runs.

Another important technical advantage of the present invention is provided by the addition of carbon monoxide to the flow of a carbonyl precursor for deposition of cobalt. The addition of carbon monoxide, a reaction by-product of carbonyl precursors for cobalt deposition, suppresses premature decomposition of the precursor to provide reduced contaminants in the process chamber and the deposited film. In addition, carbon monoxide is a reducing agent which drives down the oxygen content of the CVD cobalt film. Thus, addition of carbon monoxide to a carbonyl precursor flow enables deposition of a smooth, high purity, well adherent CVD cobalt film in a repeatable manner that is well suited for commercial use as a cobalt glue and nucleation layer for CVD copper films.

BRIEF DESCRIPTION OF THE DRAWINGS

A more complete understanding of the present invention and advantages thereof may be acquired by referring to the following description, taken in conjunction with the accompanying drawings, in which like reference numbers indicate like features, and wherein.

DETAILED DESCRIPTION OF THE INVENTION

Preferred embodiments of the present invention are illustrated in the figures, like numerals being used referred to like and corresponding parts of the various drawings.

Figure 1:
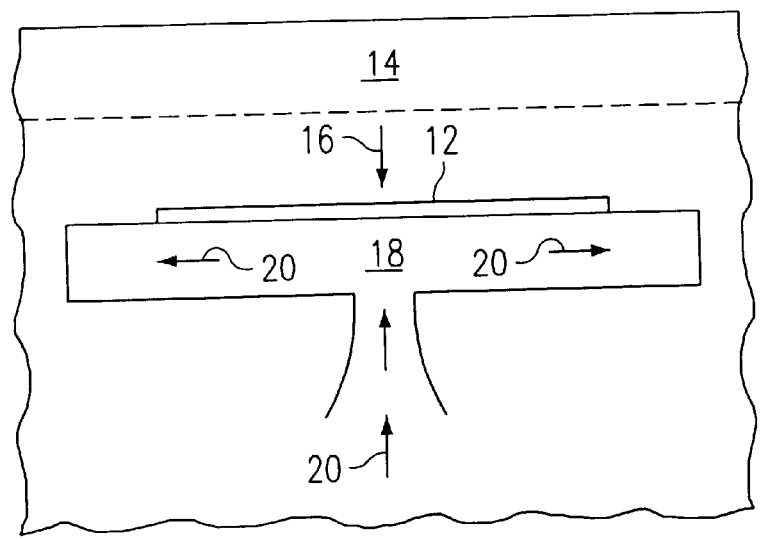
FIG. 1 depicts a side cutaway view of a substrate in a CVD chamber suitable for supporting carbonyl precursor flow.

FIG. 1 depicts a conventional CVD processing chamber 10 capable of supporting deposition of a material on a substrate 12. A precursor gas flow proceeds from showerhead 14 towards substrate 12 as indicated by arrow 16. As the precursor flows over substrate 12, decomposition of the precursor results in deposition of a material from the precursor on to substrate 12. By-products of the decomposition are then exhausted from chamber 10 via vacuum pumping.

One example of a material deposited through decomposition of a CVD precursor is cobalt, which may be deposited from precursors such as $Cp_2Co$ and $CpCo(CO)_2$ or from carbonyl precursors such as $Co(CO)_3NO$. An advantage of carbonyl precursors is that films deposited by carbonyl precursors are relatively carbon free, such as impurity levels for carbon of below five percent. In contrast, alternative precursors for depositing cobalt typically result in greater than ten percent carbon impurity incorporation.

Although carbonyl precursors for cobalt deposition provide material films with improved purity and reduced carbon content, the quality of the cobalt film deposited by carbonyl precursors tends to drift with repeated deposition processes over multiple wafer runs. The carbonyl precursors tend to prematurely decompose and react in gas phase before reaching substrate 12, thus producing soot-like particulate formation on showerhead 14 and chamber walls 10 that lead to significant process drift and poor repeatability. Analysis of reaction by-products during deposition with carbonyl precursors for cobalt confirm that $CoC_xO_y$ is formed upon premature decomposition of the carbonyl precursor in a hot zone adjacent to substrate 12. Thermophoretic forces transfer these lower volatility by-product compounds to the showerhead where they condense. To obtain repeatable cobalt deposition with a carbonyl precursor, premature gas-phase decomposition should be substantially reduced.

One method of reducing premature decomposition is the addition of $NH_3$ and $SiH_4$ to the precursor flow to suppress gas phase reaction. However these additives tended to compromise the CVD cobalt film quality, resulting in higher resistivity films of approximately 100 to 400 $\mu\Omega\cdot cm$. In addition, these films exhibit less desirable characteristics, such as films with approximately fifteen percent $R_a$ (rms surface roughness) of film thickness, step coverage of approximately ten percent and substantial deviations from the deposition temperature for the barrier of TaN of 400° C. Further, the adhesive qualities for copper provided by the cobalt glue layer was also compromised in some instances.

An improved process for substantially reducing premature decomposition of the carbonyl precursor includes a flow of excess carbon monoxide with the precursor flow. Carbon monoxide is a natural by-product of the decomposition of a carbonyl precursor and substantially reduces premature decomposition of the precursor in the gas phase. Additionally, carbon monoxide acts as a reducing agent which drives down oxygen content in the material film deposited by the carbonyl precursor.

An exemplary deposition of a cobalt material film illustrates the improved film quality provided by deposition of cobalt with a carbonyl precursor and an added flow of carbon monoxide. A conventional warm-wall stainless steel processing chamber 10 with wall temperature regulated at 45° C. supports deposition of a cobalt film on a substrate 12 with the carbonyl precursor of $Co(CO)_3NO$. Precursor is introduced to processing chamber 10 through a temperature controlled multizone showerhead 14. A two-zone resistively-heated chuck 18 supports substrate 12 with a backside Argon gas flow depicted by arrows 20 to ensure good thermal contact and uniform wafer temperature. A turbo molecular pump establishes good base pressure of approximately $10^{-6}$ Torr prior to deposition and a dry pump is used to pump the precursor through the process. The carbonyl precursor is sublimed in a bubbler held at 0° C. and then metered by a vapor source MFC. Excess $H_2$ is used as a diluent gas.

Deposition of the cobalt film proceeds under conventional process conditions with the exception of the addition of carbon monoxide gas flow. For instance, conventional deposition of cobalt with carbonyl precursor is provided with a flow of 1 sccm of the precursor $Co(CO)_3NO$ transported by 15 sccm of helium carrier gas and 1500 sccm of hydrogen gas. Moreover, 15 sccm of backside argon gas flows from the support chuck backside while a 2 Torr chamber pressure and 400° C. substrate temperature are maintained. Under these conventional process conditions a significant process drift and soot-like particulate formation occur on the showerhead chamber walls. However, the addition of an excess carbon monoxide flow of 685 sccm with the precursor flow results in suppressed gas-phase decomposition of the precursor allowing for good process repeatability. Thus, the addition of by-product carbon monoxide gas to a conventional carbonyl precursor gas flow so that the total gas flow comprises approximately one-third by-product flow results in substantially less premature decomposition of the precursor, yielding deposited films of high quality in a repeatable manner.

The following table depicts the comparable qualities of films deposited without a carbon monoxide flow and with a carbon monoxide flow:

TABLE 1

Properties of CVD Co films for $H_2$-based process

| Parameter | Without CO | With CO |
|---|---|---|
| Rate | 120 Å/min | 100 Å/min |
| Nucleation delay | <10 s | <10 s |
| Uniformity (1σ) | 40% (500 Å) | ~20% |
| Resistivity | ~20 $\mu\Omega.cm$ | ~25 $\mu\Omega.cm$ |
| Step coverage (5:1 via) | ~20% | ~20% |
| Purity | ~15% [O], <, 1% [C] | <1% [C] & [O] |
| Roughness (Ra) | 10% of thickness | 5% of thickness |
| Microstructure Phase | hcp Co, weak texture | fcc Co, weak texture |

As apparent from Table 1, the addition of carbon monoxide gas advantageously provides repeatable process conditions by reducing particulate formation with only a slight decrease in deposition rate and slight increase in resistivity.

The addition of carbon monoxide to a carbonyl precursor flow in the gas phase drives the gas phase reaction in the reverse direction according to Le Chateliers principle, thereby suppressing premature decomposition of the precursor. Carbon monoxide is a reaction by-product of carbonyl precursor decomposition, and its addition to precursor flow is equally applicable to other co-reactants that produce carbon monoxide as a reaction by-product, such as allyl carbonyls, and other carbonyl containing cobalt precursors. An additional benefit of the addition of carbon monoxide is that it acts as a reducing agent which drives down the oxygen content in the CVD cobalt film.

Figure 2:
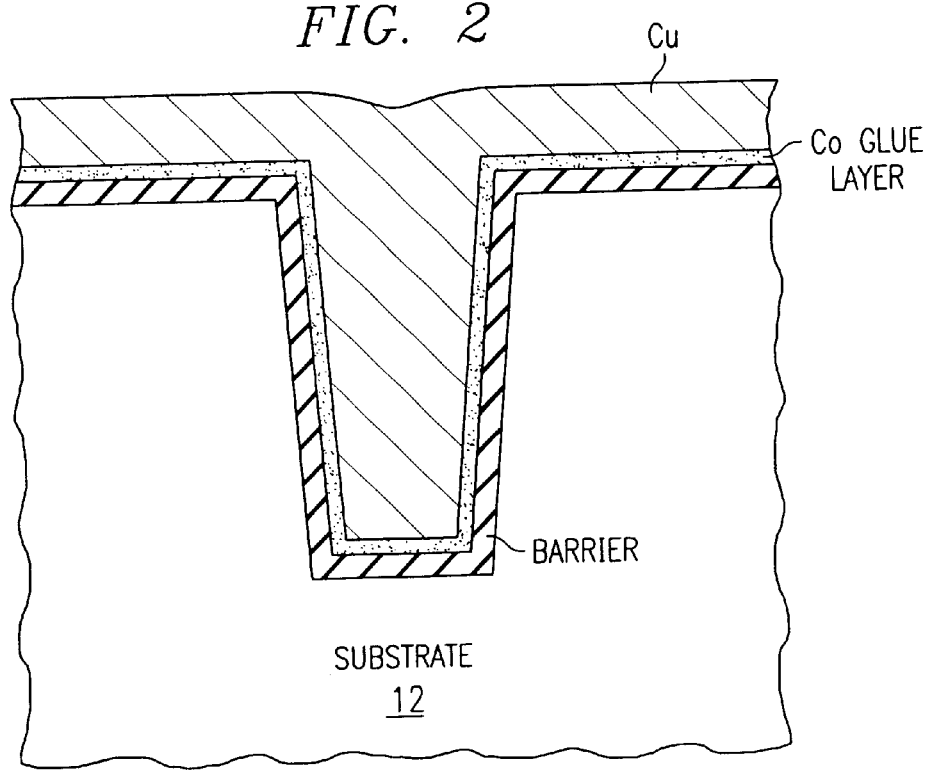
FIG. 2 depicts a side cutaway view of a substrate having a copper wire line feature.

Once a cobalt glue layer of suitable thickness is deposited, CVD of a copper layer may follow with conventional precursors, such as CUPRASELECT. FIG. 2 depicts a copper structure formed on a substrate with a cobalt glue layer aiding adhesion of the copper to the barrier layer. Excess material is then removed from the field region of the substrate with chemical mechanical polishing to define, in this example, a copper wire line structure formed in the substrate using a single or dual damascene process. Advantageously, CVD of the barrier, glue and copper layers may all be performed in a single CVD chamber or in a single cluster. Reduction of premature decomposition reduces the risk that contaminants will enter the material films.

The scope of the present invention is not limited to deposition of a specific material, such as cobalt, or deposition with a particular precursor such as carbonyl precursors. The addition of decomposition by-products to a precursor flow suppresses premature gas phase decomposition in other types of precursors and for other types of material. As one example, the addition of carbon monoxide for CVD cobalt in other applications and CVD $CoSi_2$ for forming suicides also improves process repeatability. As another example, for precursors that contain other ligands, such as NO, additions of gases that liberate these ligands also suppress premature gas phase decomposition of the precursor.

Although the present invention has been described in detail, it should be understood that various changes, substitutions and alterations can be made hereto without departing from the spirit and scope of the invention as defined by the appended claims.

What is claimed is:

1. A method for chemical-vapor deposition of cobalt on a substrate diffusion barrier, the method comprising:

flowing a carbonyl precursor into a process chamber containing the substrate, the carbonyl precursor reacting to deposit cobalt on the substrate diffusion barrier;

flowing carbon monoxide into the process chamber in conjunction with the carbonyl precursor; and flowing a precursor over the substrate for chemical vapor deposition of copper over the cobalt.

2. The method of claim 1 wherein the diffusion barrier comprises tantalum.

3. The method of claim 1 further comprising:

depositing a cobalt glue layer over the barrier layer;

ceasing the flow of the carbonyl precursor and carbon monoxide; and depositing a copper layer over the cobalt glue layer with a metalorganic precursor.

4. The method of claim 3 wherein the cobalt glue layer comprises $CoSi_2$.

5. The method of claim 1 wherein the carbonyl precursor comprises $Co(CO)_3NO$.

6. The method of claim 1 wherein the carbonyl precursor comprises an allyl carbonyl.

7. The method of claim 1 wherein at least a portion of the carbonyl precursor goes through gas-phase decomposition that releases carbon monoxide.

8. The method of claim 1 wherein the substrate diffusion barrier comprises TaN.

9. A method for chemical-vapor deposition of cobalt on a substrate diffusion barrier from a precursor, the precursor depositing the cobalt through chemical reactions that produces carbon monoxide, the method comprising:

suppressing gas-phase decomposition of the precursor by flowing carbon monoxide into the process chamber containing the substrate with the precursor flow; and depositing copper on the cobalt with metalorganic chemical vapor deposition.

10. The method of claim 9 wherein the precursor comprises a carbonyl precursor and the by-product gas comprises carbon monoxide.

11. The method of claim 10 wherein the diffusion barrier comprises tantalum.

12. The method of claim 10 wherein the precursor comprises $Co(CO)_3NO$.

13. The method of claim 12 further comprising flowing NO with the precursor.

14. The method of claim 10 wherein the material comprises a cobalt-containing compound.

15. The method of claim 14 wherein the cobalt-containing compound is $CoSi_2$.

16. A method for fabricating a copper structure on a substrate having a diffusion barrier, the method comprising:

depositing a cobalt glue layer on the barrier by flowing a carbonyl precursor over the substrate;

adding carbon monoxide flow to the carbonyl precursor flow to reduce premature gas-phase decomposition of the carbonyl precursor; and depositing a copper layer on the glue layer by flowing a copper precursor into a process chamber containing the substrate.

17. The method of claim 16 wherein:

depositing a cobalt glue layer further comprises flowing 1 sccm of $Co(CO)_3NO$ precursor with approximately 1500 sccm of helium and hydrogen gas; and adding carbon monoxide flow further comprises flowing approximately 685 sccm of carbon monoxide with the precursor, helium and hydrogen gas flow.

18. The method of claim 16 wherein depositing a copper layer further comprises flowing a metalorganic precursor over the substrate.

19. The method of claim 18 further comprising:

defining the copper structure with chemical-mechanical polishing of the substrate.

20. The method of claim 16 wherein the diffusion barrier comprises tantalum.

* * * * *